United States Patent
Ko et al.

(10) Patent No.: US 11,963,295 B2
(45) Date of Patent: Apr. 16, 2024

(54) CIRCUIT APPARATUS, MANUFACTURING METHOD THEREOF AND CIRCUIT SYSTEM

(71) Applicant: Industrial Technology Research Institute, Hsinchu (TW)

(72) Inventors: Hung-Hsien Ko, Hsinchu County (TW); Yi-Cheng Lu, Hsinchu (TW); Heng-Yin Chen, Hsinchu County (TW); Hao-Wei Yu, New Taipei (TW); Te-Hsun Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 107 days.

(21) Appl. No.: 17/585,588

(22) Filed: Jan. 27, 2022

(65) Prior Publication Data

US 2023/0138696 A1   May 4, 2023

(30) Foreign Application Priority Data

Oct. 29, 2021   (TW) .................................. 110140235

(51) Int. Cl.
*H05K 1/02* (2006.01)
*H05K 1/03* (2006.01)
*H05K 1/16* (2006.01)

(52) U.S. Cl.
CPC ............. *H05K 1/028* (2013.01); *H05K 1/038* (2013.01); *H05K 1/0393* (2013.01); *H05K 1/16* (2013.01)

(58) Field of Classification Search
CPC ........ H05K 1/038; H05K 1/0393; H05K 1/11; H05K 1/111; H05K 1/117; H05K 1/16;

(Continued)

(56) References Cited

U.S. PATENT DOCUMENTS 9,778,688 B2   10/2017   Tang et al.
10,204,855 B2   2/2019   Levander et al.
(Continued)

FOREIGN PATENT DOCUMENTS

CN   100359996   1/2008
CN   108175394   6/2018
(Continued)

OTHER PUBLICATIONS

KR 2017/0056302 A (Translation) (Year: 2023).*
(Continued)

*Primary Examiner* — Hoa C Nguyen
*Assistant Examiner* — John B Freal
(74) *Attorney, Agent, or Firm* — JCIPRNET

(57) ABSTRACT

Provided are a circuit apparatus, a manufacturing method thereof, and a circuit system. The circuit apparatus includes a flexible circuit board, a flexible packaging material layer and an electronic device. The flexible circuit board has at least one hollow pattern, wherein the flexible circuit board has an inner region and a peripheral region surrounding the inner region, and has a first surface and a second surface opposite to each other. The flexible packaging material layer is disposed in the at least one hollow pattern. The electronic device is disposed on the first surface of the flexible circuit board and electrically connected with the flexible circuit board.

19 Claims, 14 Drawing Sheets

(58) Field of Classification Search
CPC ........ H05K 1/118; H05K 1/185; H05K 1/186; H05K 1/189; H05K 2201/09036; H05K 2201/09063; H05K 2201/09081; H05K 2201/09163; H05K 2201/09172; H05K 221/09181

See application file for complete search history.

(56) References Cited

U.S. PATENT DOCUMENTS

| | | | |
|---|---|---|---|
| 10,297,572 B2 | 5/2019 | Dalal et al. | |
| 2009/0173529 A1* | 7/2009 | Lee | H05K 1/0283 29/850 |
| 2016/0338646 A1 | 11/2016 | Lee et al. | |
| 2016/0371957 A1 | 12/2016 | Ghaffari et al. | |

FOREIGN PATENT DOCUMENTS

| | | | | |
|---|---|---|---|---|
| CN | 109156077 | | 1/2019 | |
| JP | 6637896 | | 1/2020 | |
| KR | 20170056302 A | * | 5/2017 | ............ G06F 3/041 |
| TW | 200505300 | | 2/2005 | |
| TW | 200612790 | | 4/2006 | |
| TW | I394499 | | 4/2013 | |
| TW | 201902418 | | 1/2019 | |

OTHER PUBLICATIONS

Jae-Woong Jeong et al., "Capacitive Epidermal Electronics for Electrically Safe, Long-Term Electrophysiological Measurements", Adv. Healthcare Mater., vol. 3, Issue 5, May 2014, pp. 642-648.

Yung-Yu Hsu et al., "Archipelago Platform for Skin-mounted Wearable and Stretchable Electronics", 2014 IEEE 64th Electronic Components and Technology Conference (ECTC), May 2014, pp. 145-150.

"Office Action of Taiwan Counterpart Application", dated Sep. 5, 2022, p. 1-p. 10.

* cited by examiner

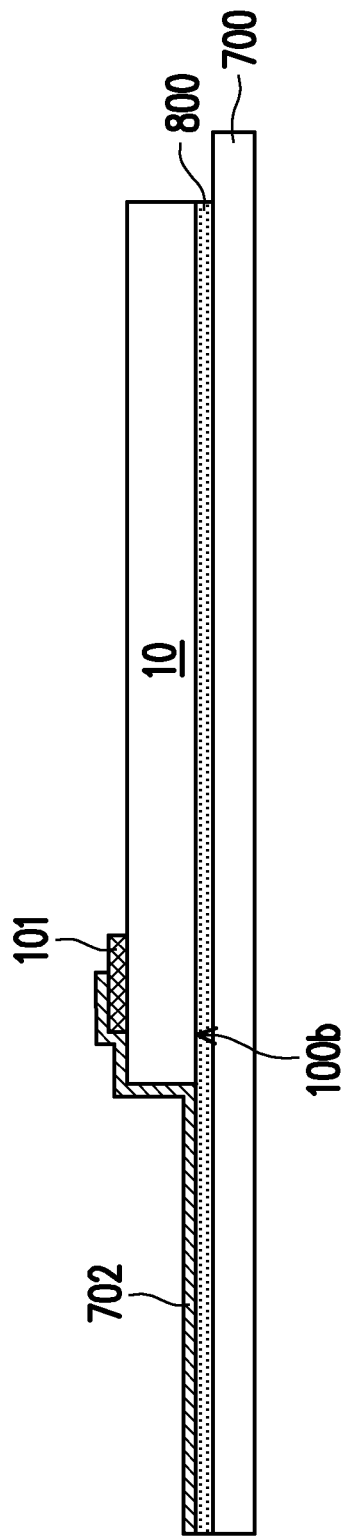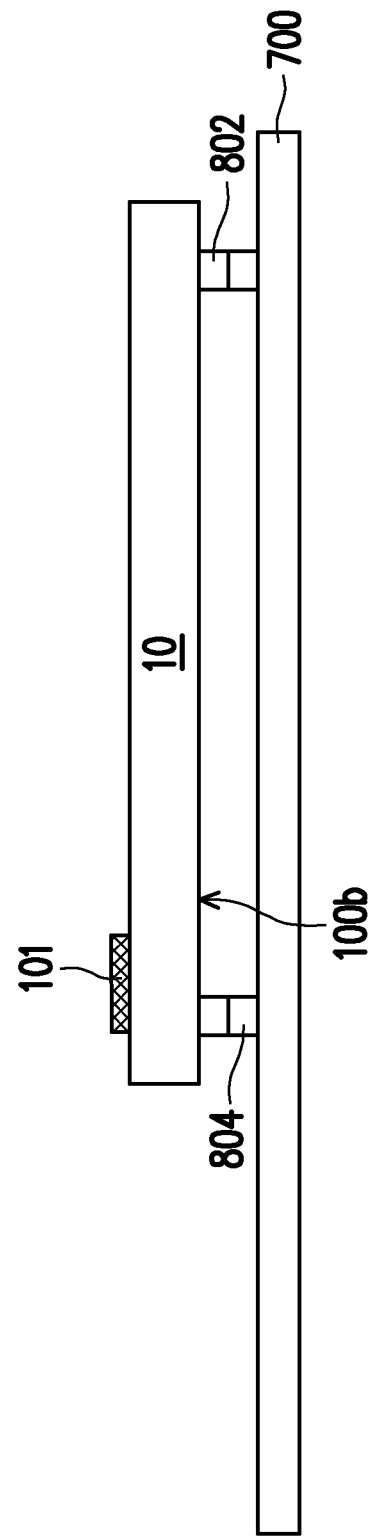

CIRCUIT APPARATUS, MANUFACTURING METHOD THEREOF AND CIRCUIT SYSTEM

CROSS-REFERENCE TO RELATED APPLICATION

This application claims the priority benefit of Taiwan application serial no. 110140235, filed on Oct. 29, 2021. The entirety of the above-mentioned patent application is hereby incorporated by reference herein and made a part of this specification.

BACKGROUND

Technical Field

The present disclosure relates to a circuit apparatus, a manufacturing method thereof and a circuit system, and also relates to a flexible circuit apparatus, a manufacturing method thereof and a circuit system.

Description of Related Art

In recent years, the technology of smart fabrics and wearable appliances has been extensively developed in industry, people's livelihood, leisure and medical care. For general smart fabrics and wearable appliances, the electronic devices are usually disposed on a circuit board by means of rigid molding and rigid packaging. Therefore, when the user performs combined actions such as continuous movement, continuous bending and stretching, it may cause problems such as bending and cracking of the circuit board, failure of the solder joints of the electronic devices, and distortion of the electronic signals.

SUMMARY

An embodiment of the present disclosure provides a circuit apparatus including a flexible circuit board, a flexible packaging material layer and an electronic device. The flexible circuit board has at least one hollow pattern, wherein the flexible circuit board has an inner region and a peripheral region surrounding the inner region, and has a first surface and a second surface opposite to each other. The flexible packaging material layer is disposed in the at least one hollow pattern. The electronic device is disposed on the first surface of the flexible circuit board and electrically connected with the flexible circuit board.

An embodiment of the present disclosure provides a manufacturing method of a circuit apparatus including the following steps. A flexible circuit board is provided. An electronic device is formed on the flexible circuit board. At least one hollow pattern is formed in the flexible circuit board. The hollow pattern is filled with a flexible packaging material.

An embodiment of the present disclosure provides a circuit system including a fabric substrate, a circuit apparatus and a conductive line. The circuit apparatus is disposed on the fabric substrate and includes a flexible circuit board, a flexible packaging material layer and an electronic device. The flexible circuit board has at least one hollow pattern, wherein the flexible circuit board has an inner region and a peripheral region surrounding the inner region, and has a first surface and a second surface opposite to each other. The flexible packaging material layer is disposed in the at least one hollow pattern. The electronic device is disposed on the first surface of the flexible circuit board and electrically connected with the flexible circuit board. The conductive line is disposed on the fabric substrate and electrically connected to the electronic device.

To make the aforementioned more comprehensible, several embodiments accompanied with drawings are described in detail as follows.

BRIEF DESCRIPTION OF THE DRAWINGS

FIGS. 8A to 8C are schematic cross-sectional views of the circuit apparatuses bonded to the fabric substrate, respectively.

DESCRIPTION OF THE EMBODIMENTS

Figure 1A:
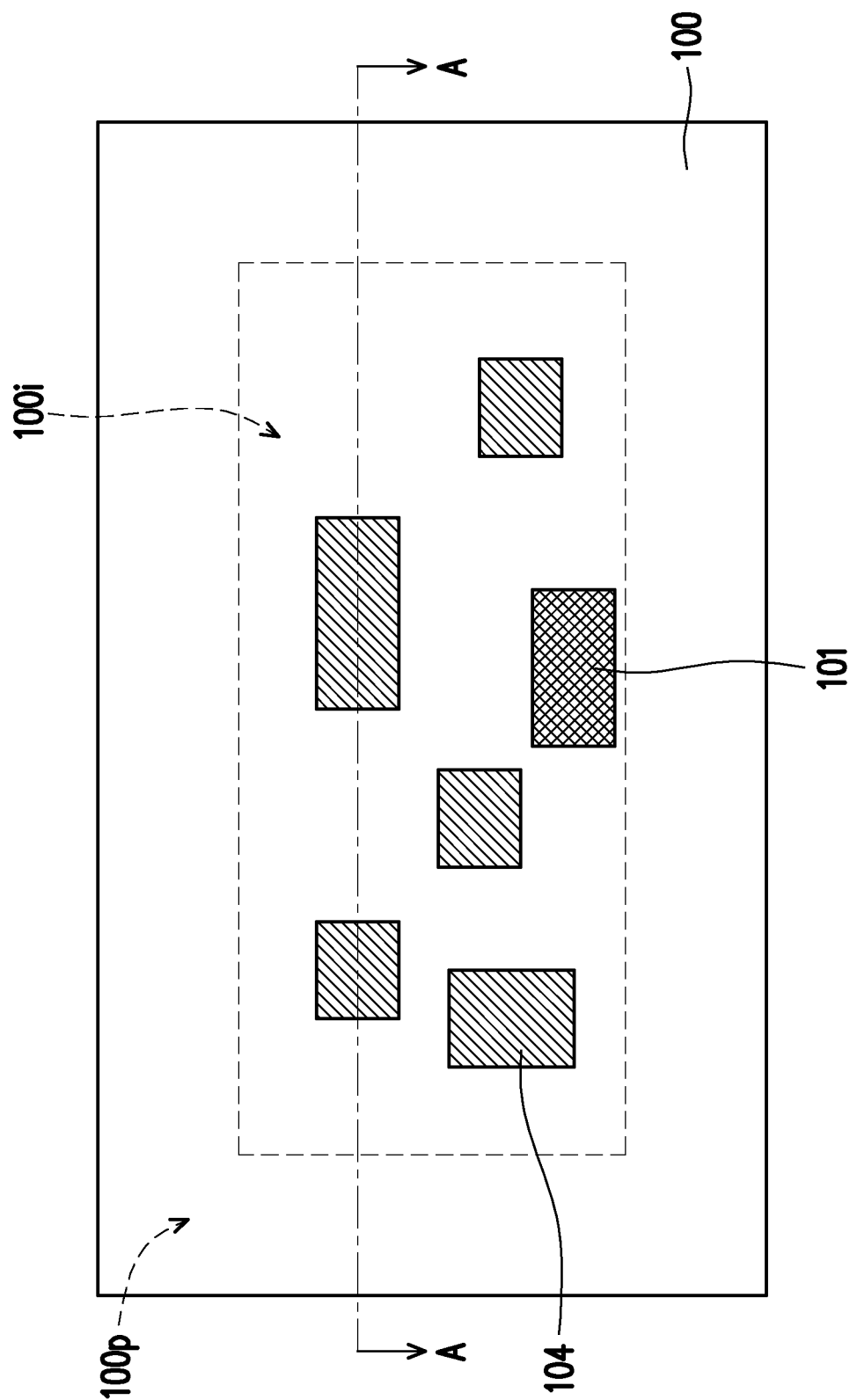
FIGS. 1A to 1C are schematic top views of a manufacturing process of a circuit apparatus of the first embodiment of the present disclosure.

The embodiments are described in detail below with reference to the accompanying drawings, but the embodiments are not intended to limit the scope of the present disclosure. In addition, the drawings are for illustrative purposes only and are not drawn to the original dimensions. For the sake of easy understanding, the same elements in the following description will be denoted by the same reference numerals.

The terms mentioned in the text, such as "comprising", "including" and "having" are all open-ended terms, i.e., meaning "including but not limited to".

When using terms such as "first" and "second" to describe a device, it is only used to distinguish these devices from each other, and does not limit the order or importance of these devices. Therefore, in some cases, the first device can also be called the second device, and the second device can also be called the first device, and this does not deviate from the scope of the present disclosure.

In addition, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

Figure 1B:
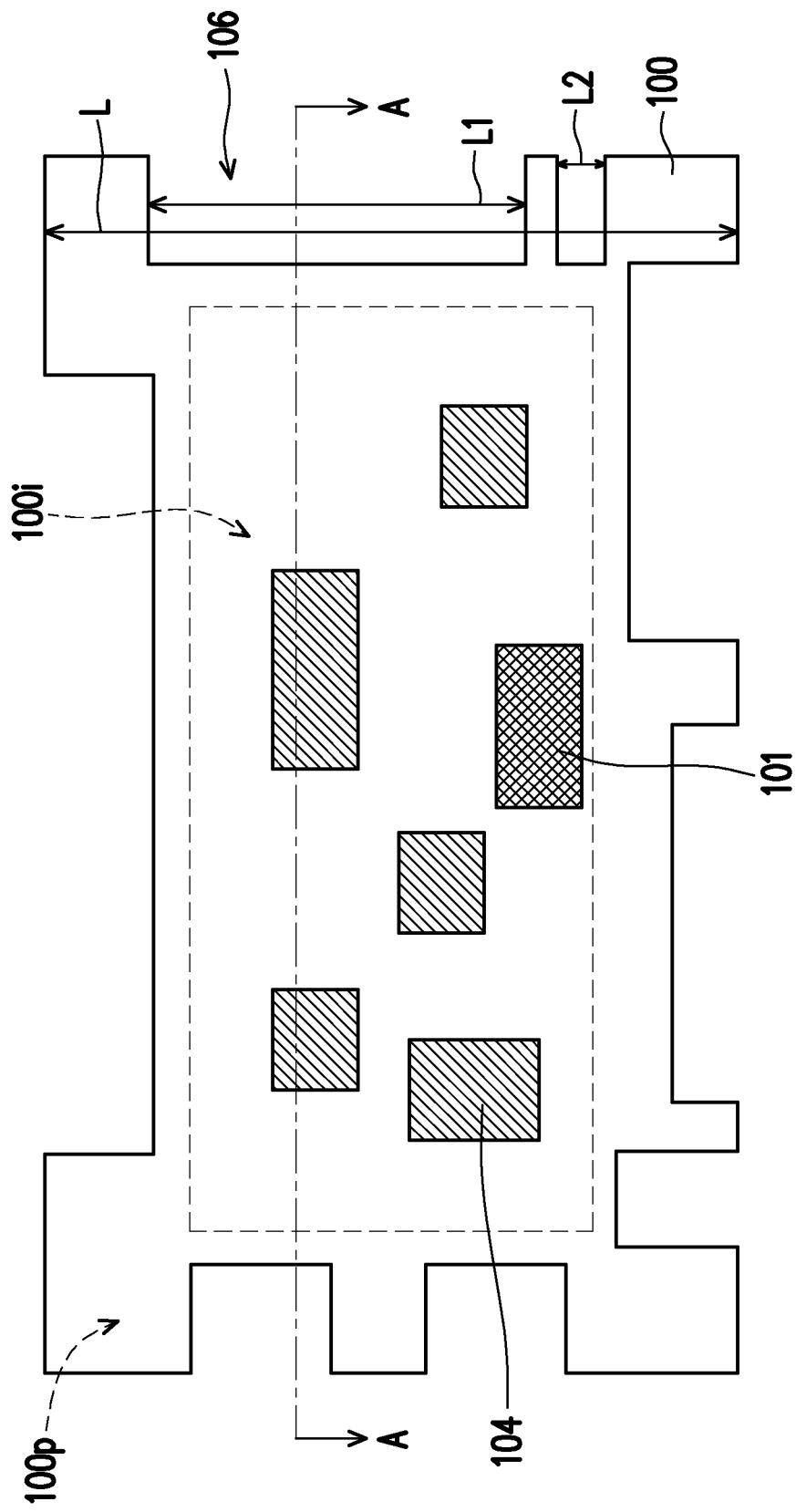
Figure 1C:
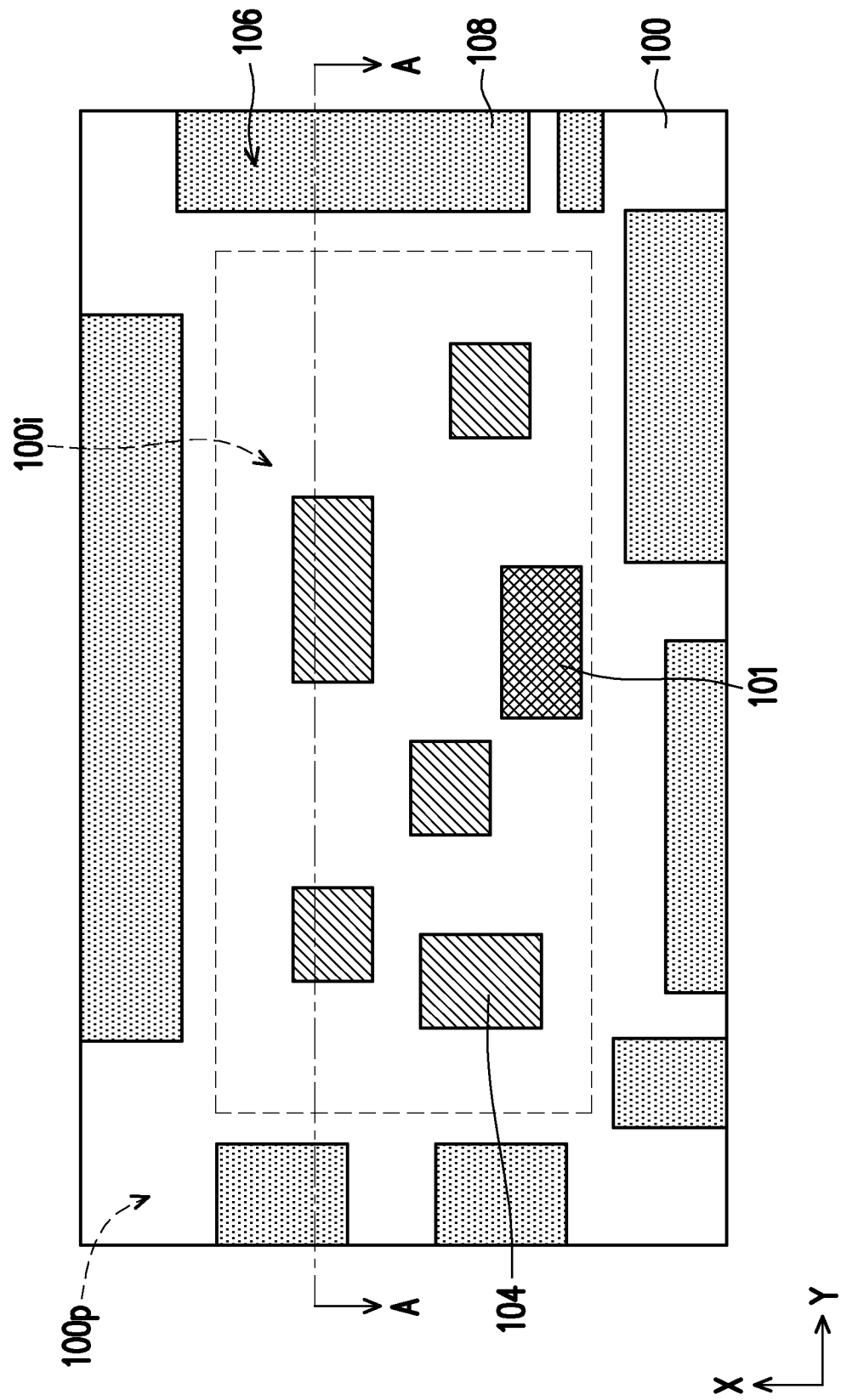
Figure 2A:
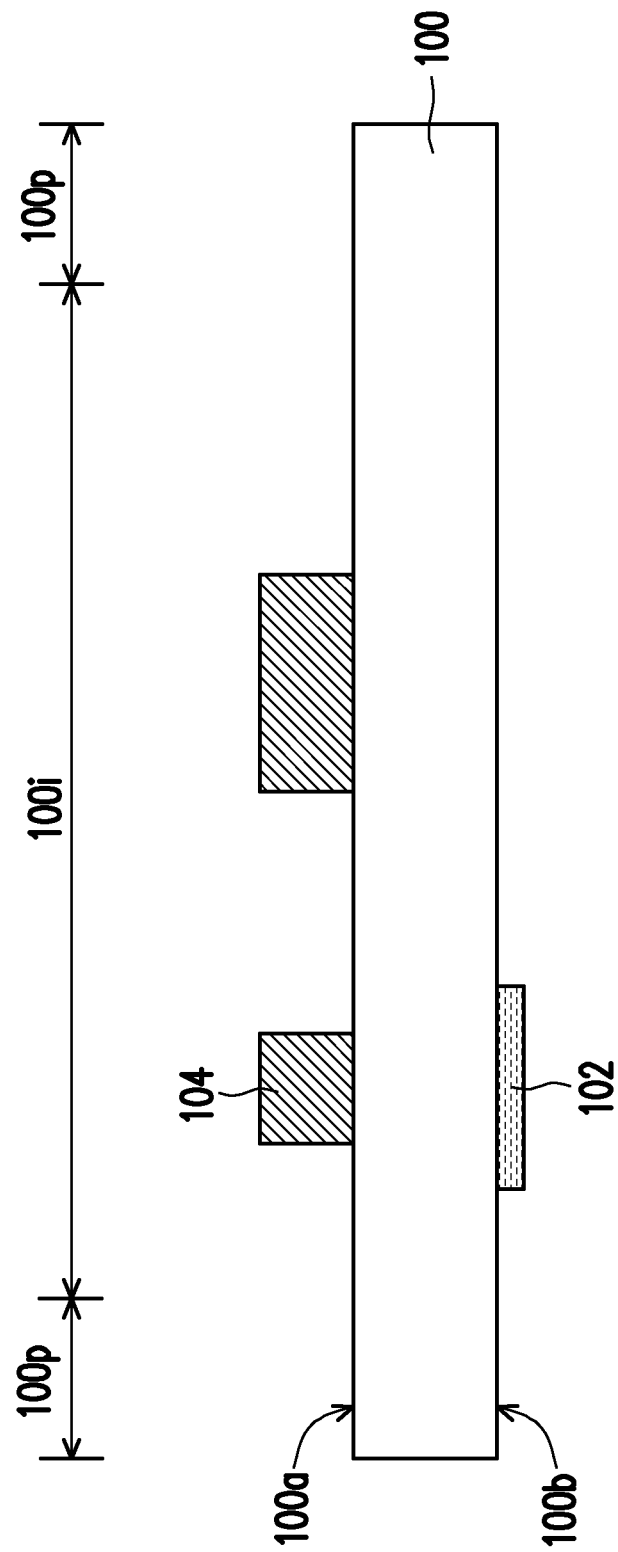
FIGS. 2A to 2C are cross-sectional schematic diagrams of the manufacturing process of the circuit apparatus along the line A-A in FIG. 1A to FIG. 1C.
Figure 2B:
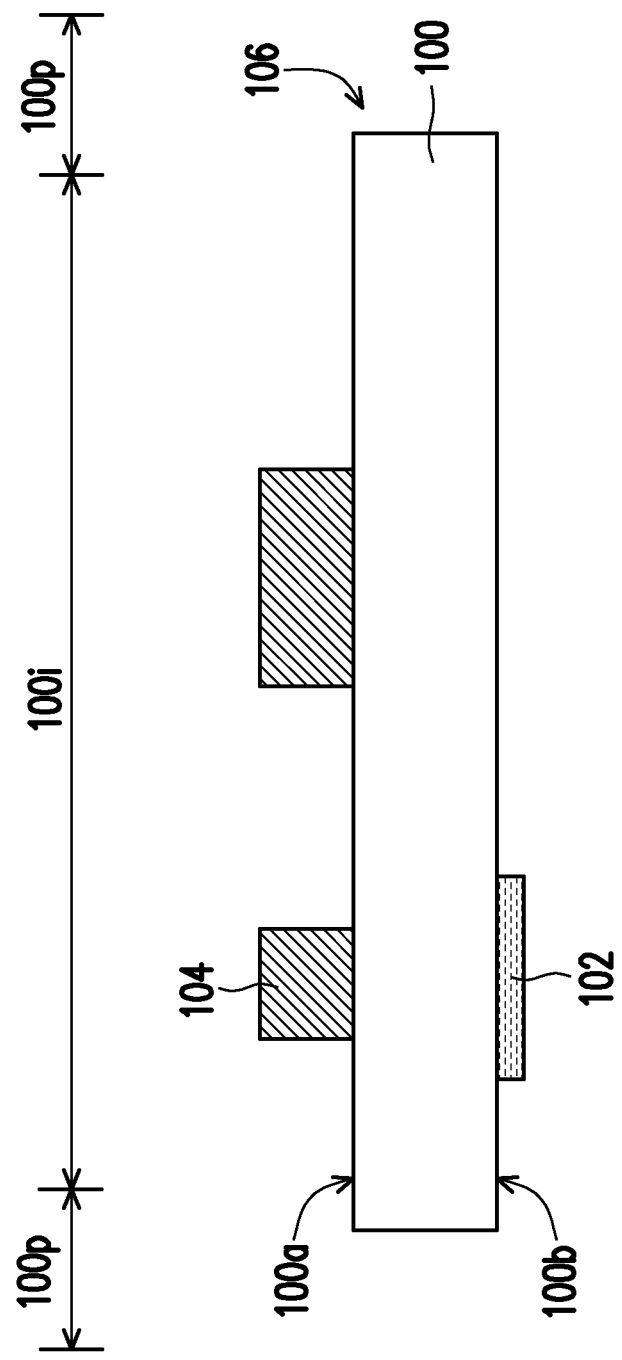
Figure 2C:
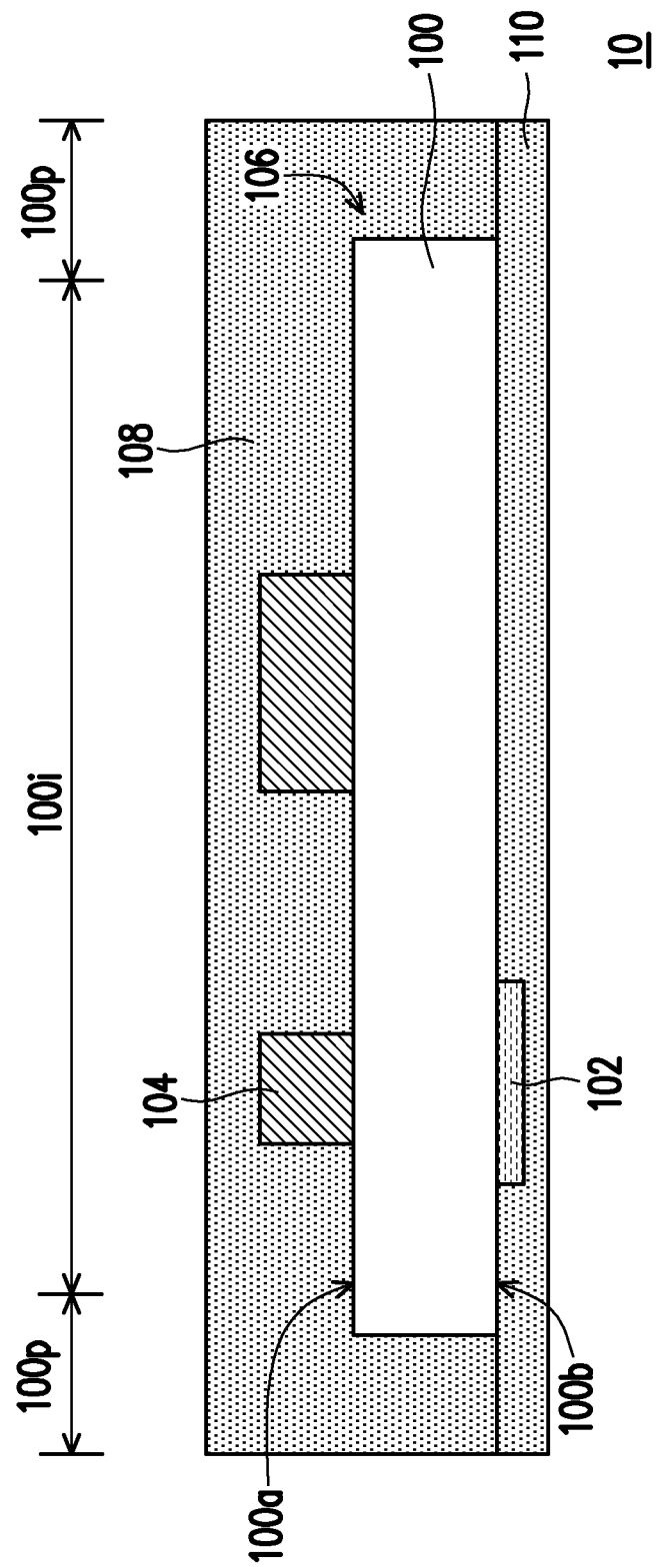

FIGS. 1A to 1C are schematic top views of a manufacturing process of a circuit apparatus of the first embodiment of the present disclosure. FIGS. 2A to 2C are cross-sectional schematic diagrams of the manufacturing process of the circuit apparatus along the line A-A in FIG. 1A to FIG. 1C.

Referring to FIGS. 1A and 2A, a flexible circuit board 100, for example, a flexible printed circuit board (FPCB), is provided. In the present embodiment, the flexible circuit board 100 may have a generally well-known structure. For example, the flexible circuit board 100 may include an insulating layer, a plurality of circuit layers disposed in the insulating layer, a plurality of pads disposed on the surface of the insulating layer and a plurality of conductive vias connecting the circuit layers and the pads, but the present disclosure is not limited thereto. In addition, in the present embodiment, the flexible circuit board 100 has a Young's modulus between 100 MPa and 10 GPa, for example. In FIGS. 1A and 2A, in order to make the drawings clear and convenient for description, only the pads are drawn, and the detailed structure of the flexible circuit board 100 is not drawn. The flexible circuit board 100 has a first surface 100*a* and a second surface 100*b* opposite to each other. In the present embodiment, the first surface 100*a* is a surface on which various electronic devices are disposed. Therefore, the first surface 100*a* may be referred to as the front side of the flexible circuit board 100, and the second surface 100*b* may be referred to as the back side of the flexible circuit board 100. In addition, the flexible circuit board 100 includes an inner region 100*i* and a peripheral region 100*p* surrounding the inner region 100*i*. In the present embodiment, the inner region 100*i* is a region in which main electronic devices are disposed. The pad 101 is disposed at the first surface 100*a* of the flexible circuit board 100 and located in the inner region 100*i*, and is used as a connection region where an external apparatus may be electrically connected to the flexible circuit board 100. In other embodiments, depending on actual layout requirements, the pad 101 may be located in the peripheral region 100*p*.

Then, the rigid material layer 102 may be disposed on the second surface 100*b* of the flexible circuit board 100. In the present embodiment, the rigid material layer 102 may be located at a position corresponding to a specific electronic device to be disposed on the first surface 100*a*, so as to provide the specific electronic device with properties such as stretch resistance and bending resistance. As a result, the specific electronic device may be prevented from being damaged when the flexible circuit board 100 is stretched and bent. In other embodiments, the rigid material layer 102 may be located at positions corresponding to all the electronic devices to be disposed on the first surface 100*a*, or the rigid material layer 102 may be omitted. In addition, in the present embodiment, the rigid material layer 102 has a Young's modulus greater than 3 GPa, for example. Next, the electronic devices 104 are disposed on the first surface 100*a* of the flexible circuit board 100. The electronic devices 104 are located in the inner region 100*i*. At this time, the rigid material layer 102 may be located under the specific electronic device 104, preferably directly under the specific electronic device 104. The electronic device 104 may be a sensing device, a signal processing device, a signal transmission device, a power source, etc., which is not limited by the present disclosure. A plurality of electronic devices 104 may be disposed on the first surface 100*a*, and the plurality of electronic devices 104 are connected in series or parallel to each other and electrically connected to the flexible circuit board 100.

Referring to FIGS. 1B and 2B, hollow patterns 106 are formed in the peripheral region 100*p* of the flexible circuit board 100. The hollow patterns 106 are formed by, for example, performing a mechanical drilling process, a laser drilling process, a mechanical cutting process, a laser cutting process or a combination thereof on the flexible circuit board 100. The hollow patterns 106 penetrates through the flexible circuit board 100. That is, the hollow patterns 106 extends from the first surface 100*a* to the second surface 100*b*. In the present embodiment, the hollow patterns 106 are formed in the peripheral region 100*p* and located on the sides of the flexible circuit board 100 other than the corners. The hollow patterns 106 may have a desired shape, size and quantity according to actual needs, which is not limited by the present disclosure.

In the present embodiment, from the top view of the flexible circuit board 100, i.e., as shown in FIG. 1B, at one side of the flexible circuit board 100, the total length of the hollow patterns 106 extending along an edge of the flexible circuit board 100 is, for example, between 1% and 90% of the length of the edge. For example, at the right side of the flexible circuit board 100 in FIG. 1B, the total length of the hollow patterns 106 extending along the edge of the flexible circuit board 100 (length L1+length L2) may be between 1% and 90% of the length L of the right side. In addition, the total area of the hollow patterns 106 is, for example, between 1% and 50% of the area of the flexible circuit board 100. The following will further explain the above-mentioned total length range and total area range.

Referring to FIGS. 1C and 2C, the flexible packaging material layer 108 is formed on the first surface 100*a* of the flexible circuit board 100. The method for forming the flexible packaging material layer 108 is, for example, a molding process. In the present embodiment, the flexible packaging material layer 108 covers the first surface 100*a* and the sidewalls of the flexible circuit board 100, and fills the hollow patterns 106. In one embodiment, the flexible packaging material layer 108 may be conformally formed on the first surface 100*a* of the flexible circuit board 100. In addition, in the present embodiment, the flexible packaging material layer 108 has a Young's modulus between 1 MPa and 300 MPa, for example.

In FIG. 1C, in order to make the drawings clear and easy to explain, only the flexible packaging material layer 108 in the hollow patterns 106 is shown, but those skilled in the art may understand that the flexible packaging material layer 108 covers the first surface 100*a*. In addition, the flexible packaging material layer 108 exposes the pad 101 so that an external apparatus (not shown) may be electrically connected to the flexible circuit board 100 through the pad 101. In this way, flexible packaging material layer 108 are formed in the peripheral region 100*p* of the flexible circuit board 100. After that, an encapsulation layer 110 may be formed on the second surface 100*b* of the flexible circuit board 100 to complete the manufacture of the circuit apparatus 10 of the present embodiment. In the present embodiment, the encapsulation layer 110 has a Young's modulus between 1 MPa and 300 MPa, for example. Therefore, in the circuit apparatus 10, the Young's modulus of the rigid material layer 102 is greater than the Young's modulus of the flexible circuit board 100, and the Young's modulus of the flexible circuit board 100 is greater than the Young's modulus of the flexible packaging material layer 108 and the encapsulation layer 110.

In the present embodiment, after the flexible packaging material layer 108 are formed, the encapsulation layer 110 is formed, but the present disclosure is not limited thereto. In other embodiments, the flexible packaging material layer 108 may be formed after the encapsulation layer 110 is formed. In other embodiments, the encapsulation layer 110 may be omitted.

In addition, in the present embodiment, the material of the flexible packaging material layer 108 is different from the material of the encapsulation layer 110, and therefore there is an interface between the flexible packaging material layer 108 and the encapsulation layer 110, but the present disclosure is not limited thereto. In other embodiments, the material of the flexible packaging material layer 108 may be the same as the material of the encapsulation layer 110, and therefore, there is no interface between the flexible packaging material layer 108 and the encapsulation layer 110.

In addition, in the present embodiment, the flexible packaging material layer 108 covers all the electronic devices 104, but the present disclosure is not limited thereto. In other embodiments, the flexible packaging material layers 108 may expose at least one electronic device 104.

In the present embodiment, the flexible packaging material layer 108 is located in the peripheral region 100p of the flexible circuit board 100. Based on the characteristics of the flexible packaging material layer 108 itself, the stretch resistance of the flexible circuit board 100 may be effectively improved, and thus the circuit apparatus 10 may be prevented from being damaged during the continuous stretching action. As shown in FIG. 1C, in the circuit apparatus 10, hollow patterns 106 are formed at the four sides of the flexible circuit board 100 and the flexible packaging material layer 108 is filled in the hollow patterns 106. Therefore, when the circuit apparatus 10 is subjected to a tensile force in the X direction or Y direction, the flexible circuit board 100 may have greater tensile resistance. In other embodiments, depending on the actual application of the circuit apparatus 10, the hollow patterns 106 may be formed only at one side, two sides or three sides of the flexible circuit board 100.

In the present embodiment, at one side of the flexible circuit board 100, the total length of the hollow patterns 106 extending along the edge of the flexible circuit board 100 is, for example, between 1% and 90% of the length of the side. When the total length is less than 1% of the length of the side, the stretch resistance of the flexible circuit board 100 may not be effectively improved. When the total length is greater than 90% of the length of the side, the mechanical strength of the flexible circuit board 100 may be reduced. In one embodiment, at one side of the flexible circuit board 100, the total length of the hollow patterns 106 extending along the edge of the flexible circuit board 100 may be between 2.6% and 25.1% of the length of the side.

In addition, the total area of the hollow patterns 106 is, for example, between 1% and 50% of the area of the flexible circuit board 100. When the total area is less than 1% of the area of the flexible circuit board 100, the stretch resistance of the flexible circuit board 100 may not be effectively improved. When the total area is greater than 50% of the area of the flexible circuit board 100, the mechanical strength of the flexible circuit board 100 may be reduced, and the layout area of the electronic device 104 may be too small. In an embodiment, the total area of the hollow patterns 106 may be 25.1% of the area of the flexible circuit board 100.

In the present embodiment, the hollow patterns 106 are only formed in the peripheral region 100p of the flexible circuit board 100 and located on the sides other than the corners of the flexible circuit board 100, but the present disclosure is not limited thereto. Depending on the actual application of the circuit apparatus 10, the hollow patterns 106 may be formed in other regions of the flexible circuit board 100, which will be described below.

Figure 3:
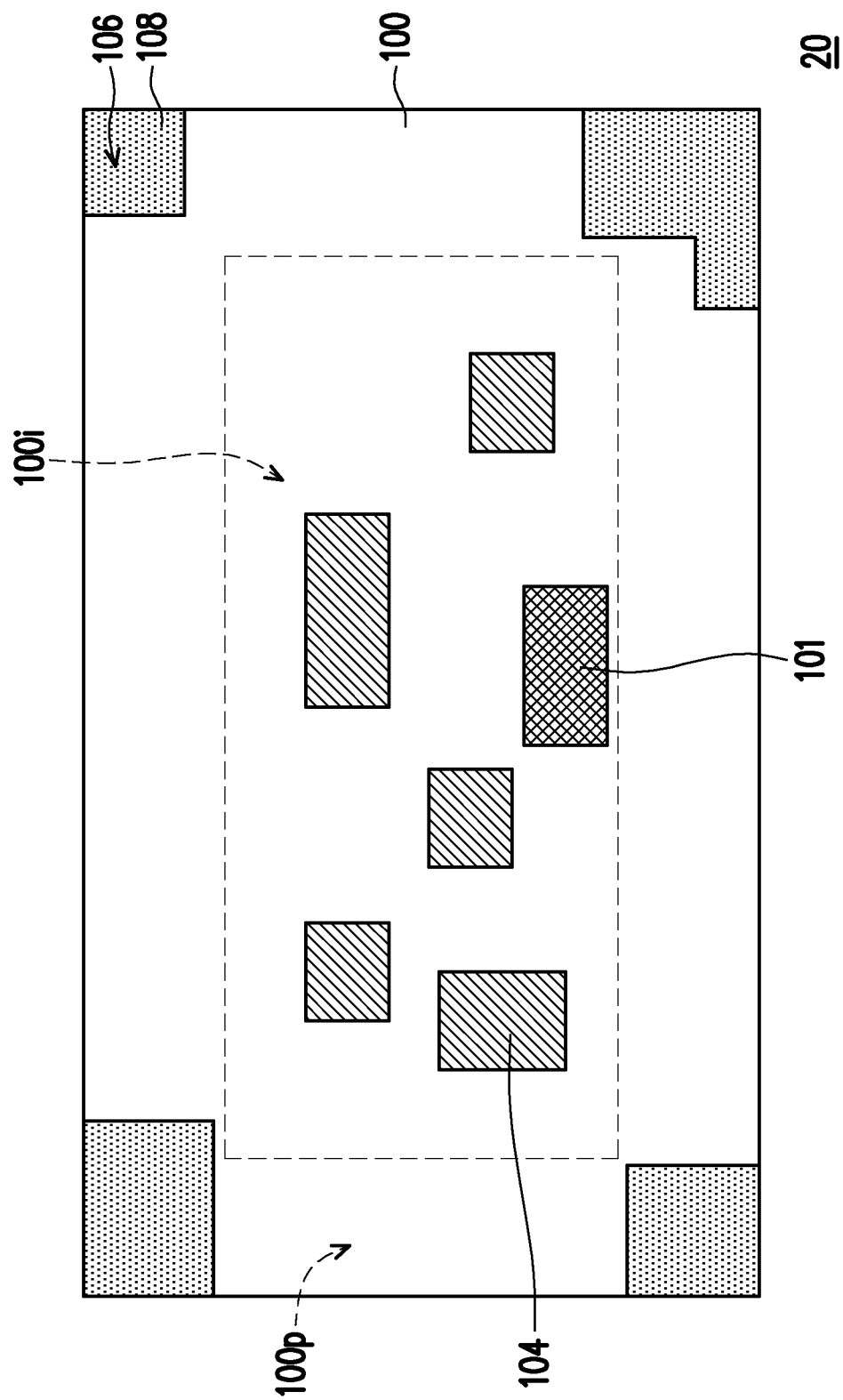
FIG. 3 is a schematic top view of a circuit apparatus of the second embodiment of the present disclosure.

FIG. 3 is a schematic top view of a circuit apparatus of the second embodiment of the present disclosure. In the present embodiment, the same component as that in the first embodiment will be represented by the same reference number, and no further description will be made. Referring to FIG. 3, the difference between the present embodiment and the first embodiment is: in the circuit apparatus 20, the hollow patterns 106 are only formed in the peripheral region 100p of the flexible circuit board 100, and located at the four corners of the flexible circuit board 100. In addition, the shapes and sizes of the hollow patterns 106 may be adjusted arbitrarily, which is not limited by the present disclosure. Depending on the actual application of the circuit apparatus 20, in other embodiments, the hollow patterns 106 may be formed only at one corner, two corners or three corners of the flexible circuit board 100.

In the present embodiment, at one side of the flexible circuit board 100, the total length of the hollow patterns 106 extending along the edge of the flexible circuit board 100 is, for example, between 1% and 90% of the length of the side. In addition, the total area of the hollow patterns 106 is, for example, between 1% and 50% of the area of the flexible circuit board 100.

Figure 4:
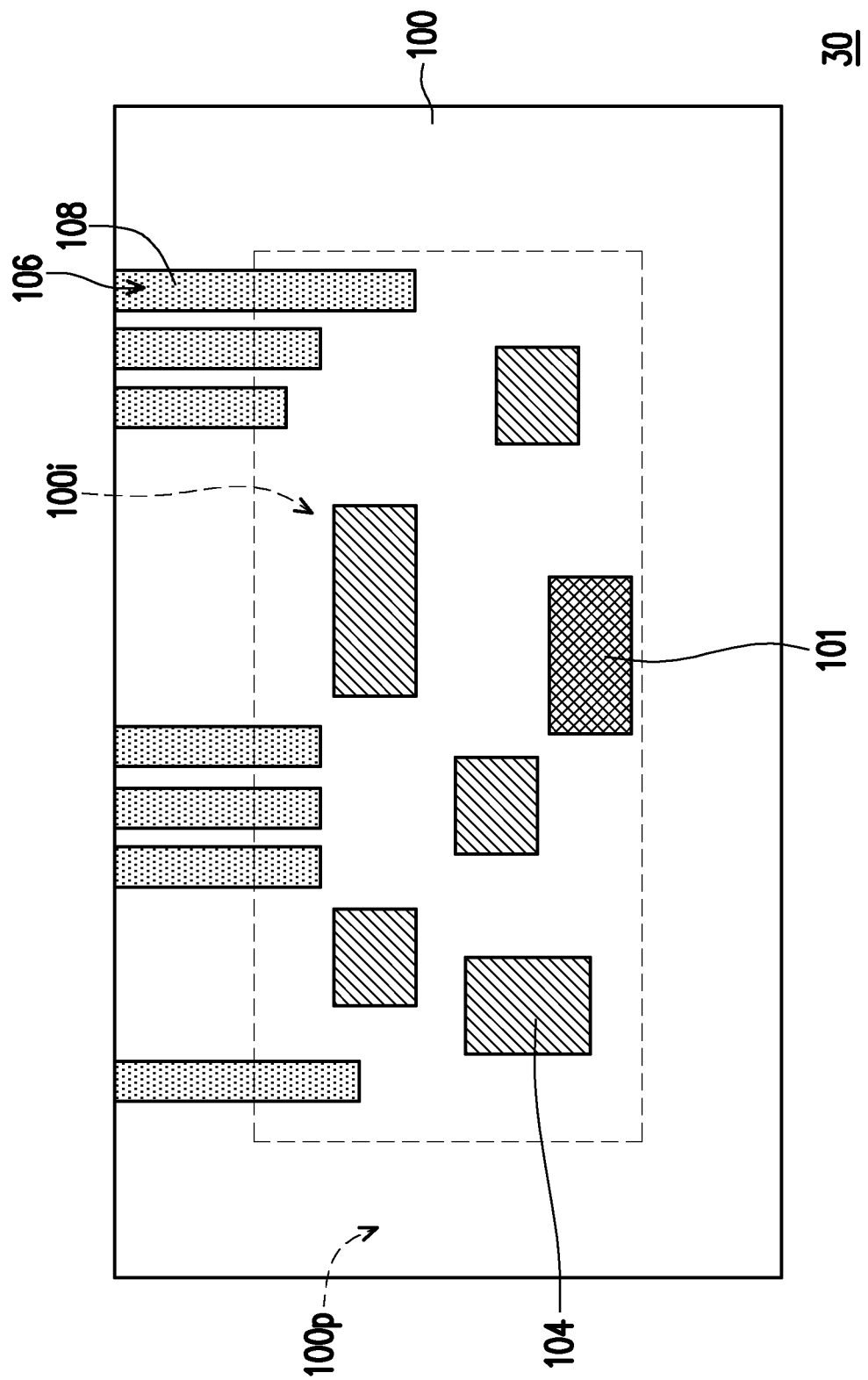
FIG. 4 is a schematic top view of a circuit apparatus of the third embodiment of the present disclosure.

FIG. 4 is a schematic top view of a circuit apparatus of the third embodiment of the present disclosure. In the present embodiment, the same component as that in the first embodiment will be represented by the same reference number, and no further description will be made. Referring to FIG. 4, the difference between the present embodiment and the first embodiment is: in the circuit apparatus 30, the hollow patterns 106 are located at one side other than the corners of the flexible circuit board 100, and extend from the edge of the flexible circuit board 100 into the inner region 100i. In addition, the positions, numbers, shapes and sizes of the hollow patterns 106 may be adjusted arbitrarily, which is not limited by the present disclosure. Depending on the actual application of the circuit apparatus 30, in other embodiments, the hollow patterns 106 may be formed at two sides, three sides or four sides other than the corners of the flexible circuit board 100.

Figure 5:
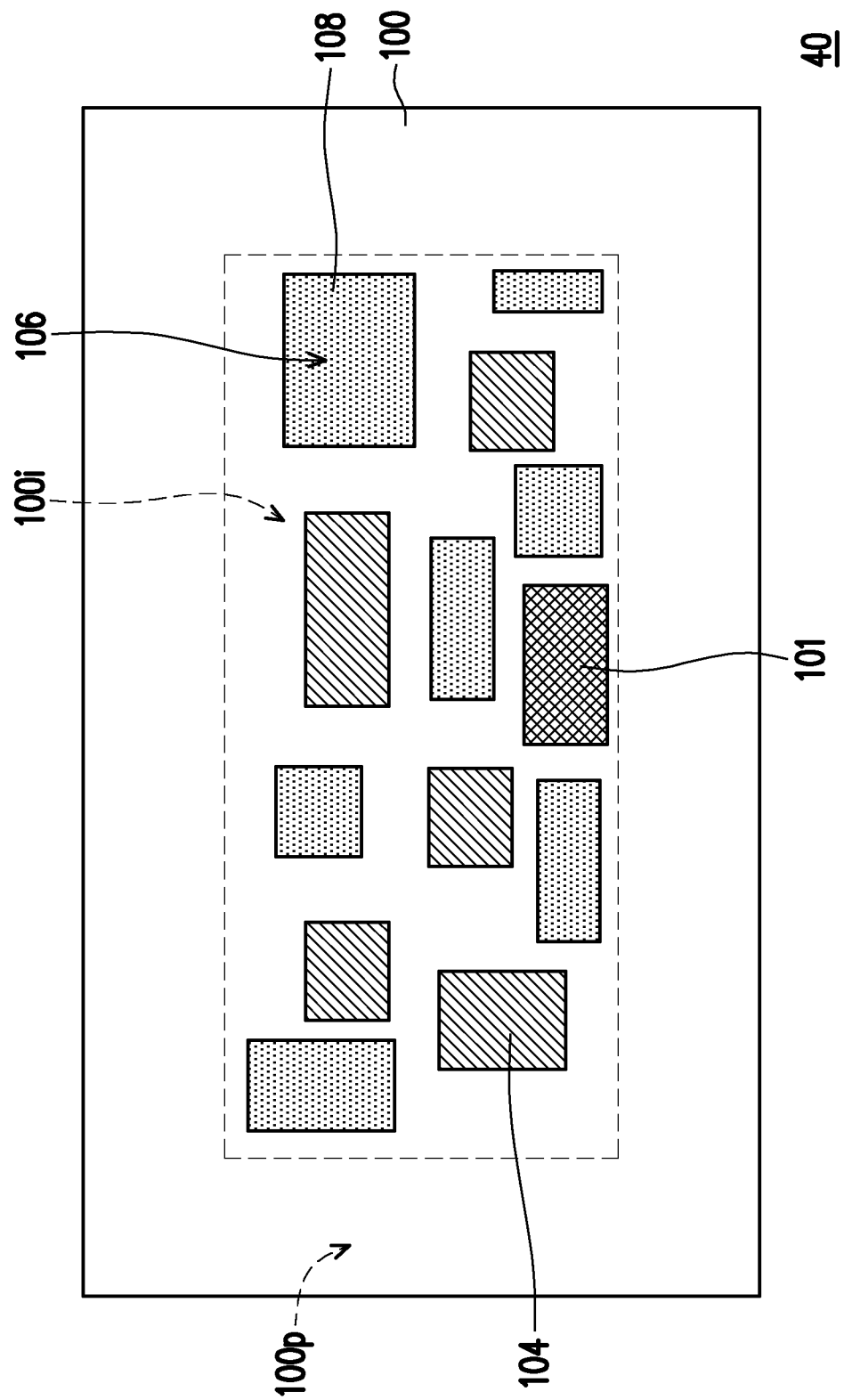
FIG. 5 is a schematic top view of a circuit apparatus of the fourth embodiment of the present disclosure.

FIG. 5 is a schematic top view of a circuit apparatus of the fourth embodiment of the present disclosure. In the present embodiment, the same component as that in the first embodiment will be represented by the same reference number, and no further description will be made. Referring to FIG. 5, the difference between the present embodiment and the first embodiment is that in the circuit apparatus 40, the hollow patterns 106 are not formed in the peripheral region 100p, but is independently formed in the inner region 100i. In addition, the positions, numbers, shapes and sizes of the hollow patterns 106 may be adjusted arbitrarily, which is not limited by the present disclosure.

In addition, according to actual requirements, in other embodiments, any or all of the first embodiment, the second embodiment, the third embodiment and the fourth embodiment may be combined arbitrarily to improve the stretch resistance of the flexible circuit board.

Figure 6A:
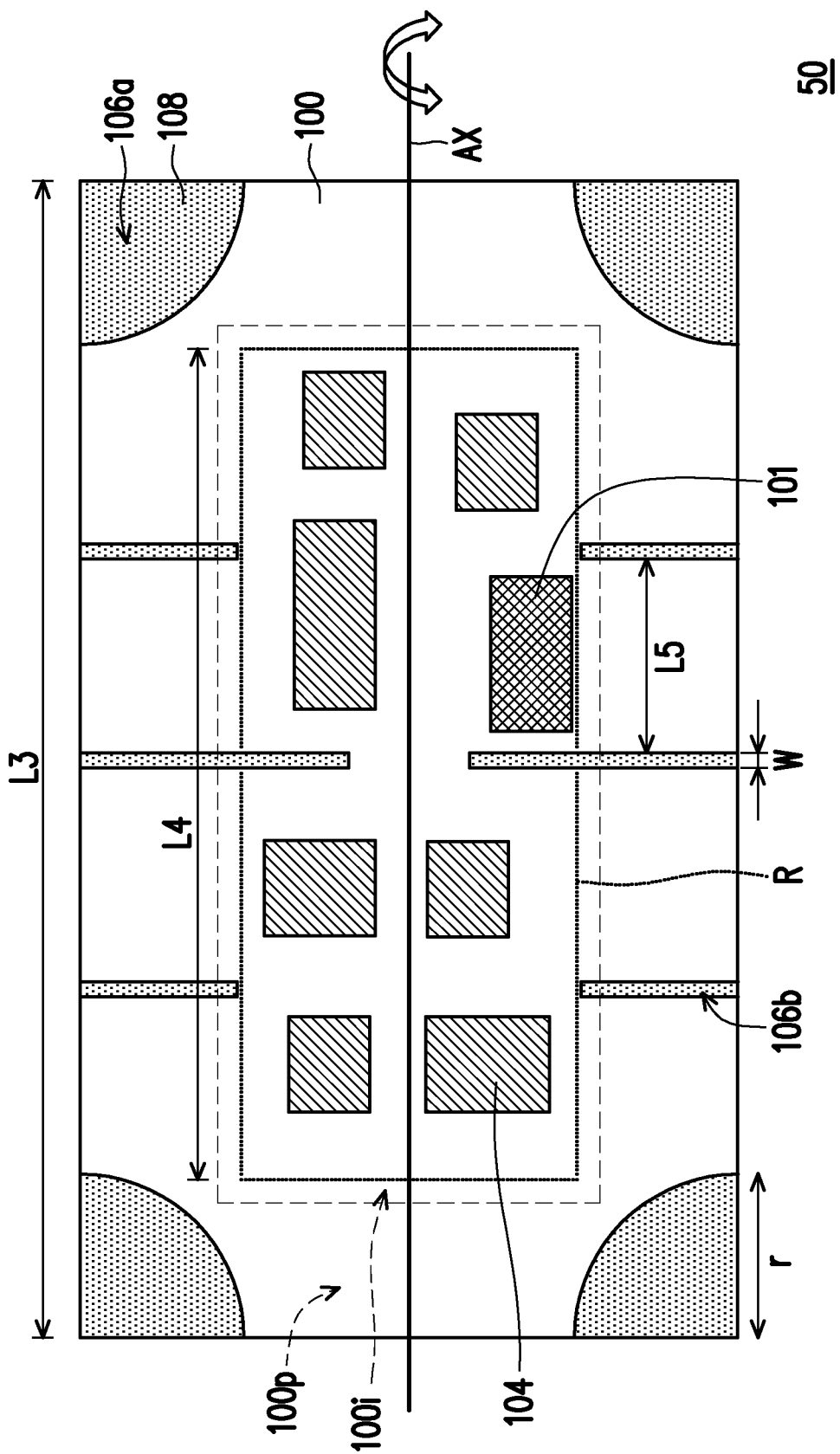
FIG. 6A is a schematic top view of a circuit apparatus of the fifth embodiment of the present disclosure.

FIG. 6A is a schematic top view of a circuit apparatus of the fifth embodiment of the present disclosure. In the present embodiment, the same component as that in the first embodiment will be represented by the same reference number, and no further description will be made. Referring to FIG. 6A, the difference between the present embodiment and the first embodiment is: in the circuit apparatus 50, the fan-shaped hollow patterns 106a are formed at the four corners of the flexible circuit board 100, and the strip-shaped hollow patterns 106b extend from the edge of the flexible circuit board 100 into the inner area 100i. In addition, the electronic devices 104 are located in the device region R in the inner region 100i.

In the present embodiment, since the fan-shaped hollow patterns 106a are formed at the four corners of the flexible circuit board 100, when the circuit apparatus 50 is twisted with the torsion axis AX, the flexible circuit board 100 may have a higher bending resistance. In addition, the strip-shaped hollow patterns 106b extend from the edge of the flexible circuit board 100 into the inner region 100i in a direction perpendicular to the torsion axis AX. Therefore, the flexible circuit board 100 may have higher tensile resistance during the twist. In this way, the flexible circuit board 100 may be effectively prevented from being damaged when the circuit apparatus 50 is twisted.

In one embodiment, in the case where the circuit apparatus 50 is designed to be twisted by 30° clockwise or counterclockwise with the torsion axis AX, at one side of the flexible circuit board 100, the total area of the hollow patterns 106a and the hollow patterns 106b is between 7.85% and 31.4% of the area of the flexible circuit board 100. In addition, for the flexible circuit board 100 with a size of 80 mm×50 mm, the radius r of each of the fan-shaped hollow patterns 106a may be 5 mm, and the length of each of the strip-shaped hollow patterns 106b extending along the edge of the flexible circuit board 100, i.e., the width W of each of the hollow pattern 106b, may be 2 mm. For the device region R, the length L4 of the long side of the device region R may be between 4/7 and 5/7 of the length L3 of the long side of the flexible circuit board 100. For the region used to connect with external appliances, the length L5 between adjacent strip-shaped hollow patterns 106b may be between 1/7 and 3/14 of the length L3 of the long side of the flexible circuit board 100.

Figure 6B:
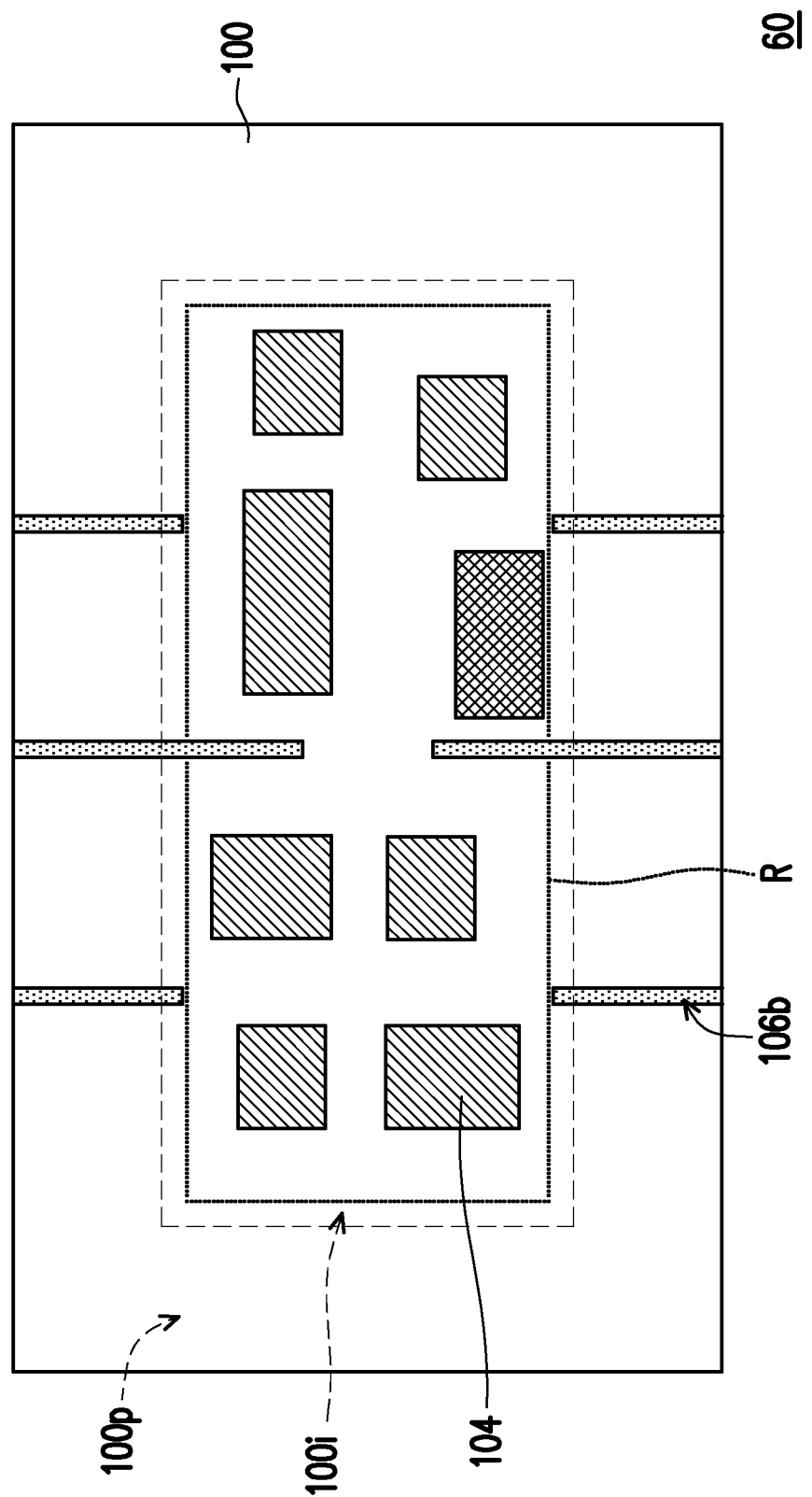
FIG. 6B is a schematic top view of a circuit apparatus of the sixth embodiment of the present disclosure.

FIG. 6B is a schematic top view of a circuit apparatus of the sixth embodiment of the present disclosure. Referring to FIG. 6B, the difference between the present embodiment and the fifth embodiment is: in the circuit apparatus 60, the flexible circuit board 100 does not have fan-shaped hollow patterns 106a at the four corners.

The circuit apparatus of the present disclosure may be disposed on the fabric and may be connected to the external apparatus through a conductive line to form the circuit system of the present disclosure, and may be applied to smart fabrics or wearable appliances. In the following, the circuit apparatus 10 is taken as an example to describe the circuit system of the present disclosure embodiment, and the circuit apparatus of other embodiments may be disposed on the fabric as the circuit apparatus 10.

Figure 7:
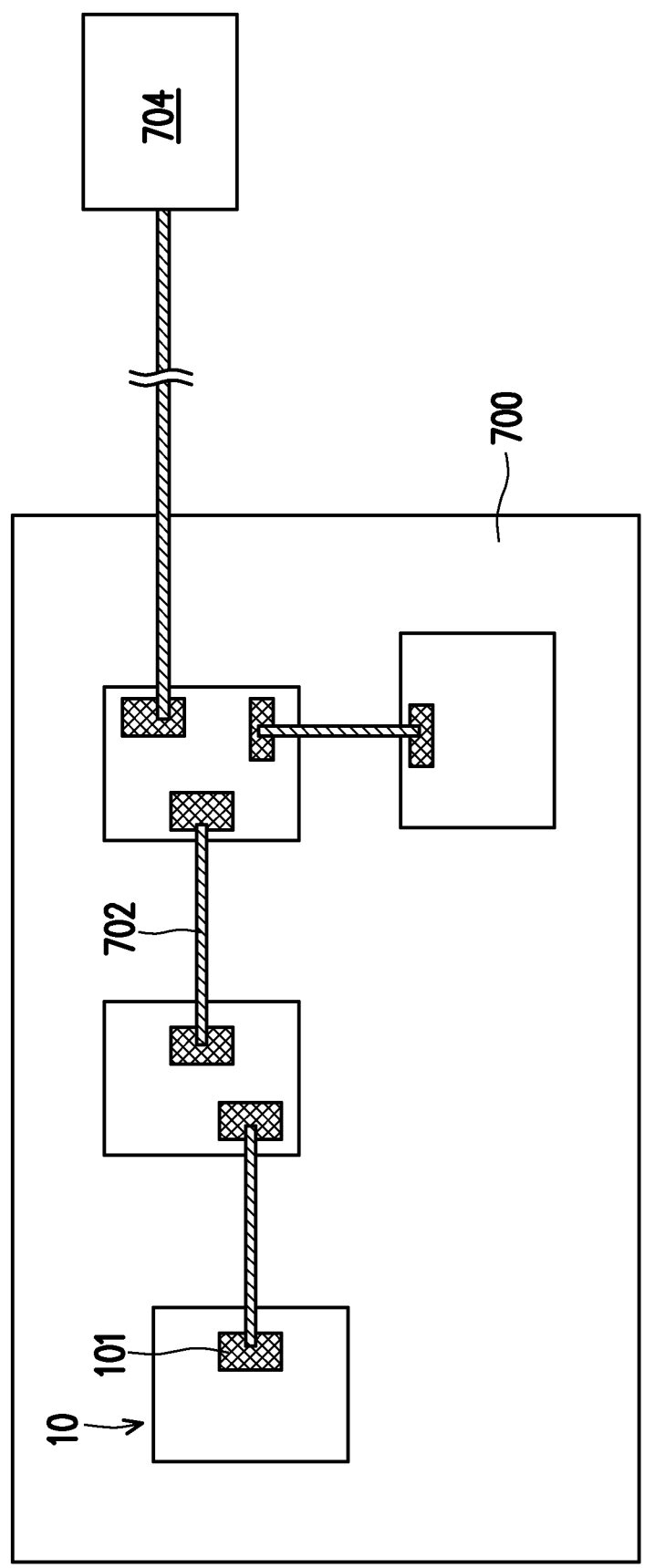
FIG. 7 is a schematic top view of a circuit system of an embodiment of the present disclosure.

FIG. 7 is a schematic top view of a circuit system of an embodiment of the present disclosure. Referring to FIG. 7, the circuit system 70 includes a fabric substrate 700, a plurality of circuit apparatuses 10 and a plurality of conductive lines 702. The fabric substrate 700 may be various fabrics, which is not limited by the present disclosure. The circuit apparatuses 10 are disposed on the fabric substrate 700. The conductive lines 702 are disposed on the fabric substrate 700 and connected to the pads 101 of the circuit apparatuses 10 to electrically connect the circuit apparatuses 10 to each other. In addition, according to actual needs, the circuit system 70 may be connected to the required external device 704 through the conductive line 702.

The circuit apparatus 10 may be disposed on the fabric substrate 700 in various ways. As shown in FIG. 8A, the adhesion layer 800 is disposed between the second surface 100b of the flexible circuit board 100 (see FIG. 2C) and the fabric substrate 700 and between the conductive lines 702 and the fabric substrate 700. In this way, the circuit apparatuses 10 and the conductive lines 702 may be firmly bonded with the fabric substrate 700.

As shown in FIG. 8B, the first fixing apparatuses 802 are disposed on the second surface 100b (see FIG. 2C) of the flexible circuit board 100, the second fixing apparatuses 804 are disposed on the fabric substrate 700, and the first fixing apparatuses 802 and the second fixing apparatuses 804 are attached together, so that the circuit apparatuses 10 may be firmly bonded with the fabric substrate 700. The first fixing apparatuses 802 and the second fixing apparatuses 804 may be attached together through fasteners, magnetic attraction, electrostatic attraction or pasting, which is not limited by the present disclosure. In this way, the circuit apparatuses 10 may be firmly bonded with the fabric substrate 700.

Figure 8C:
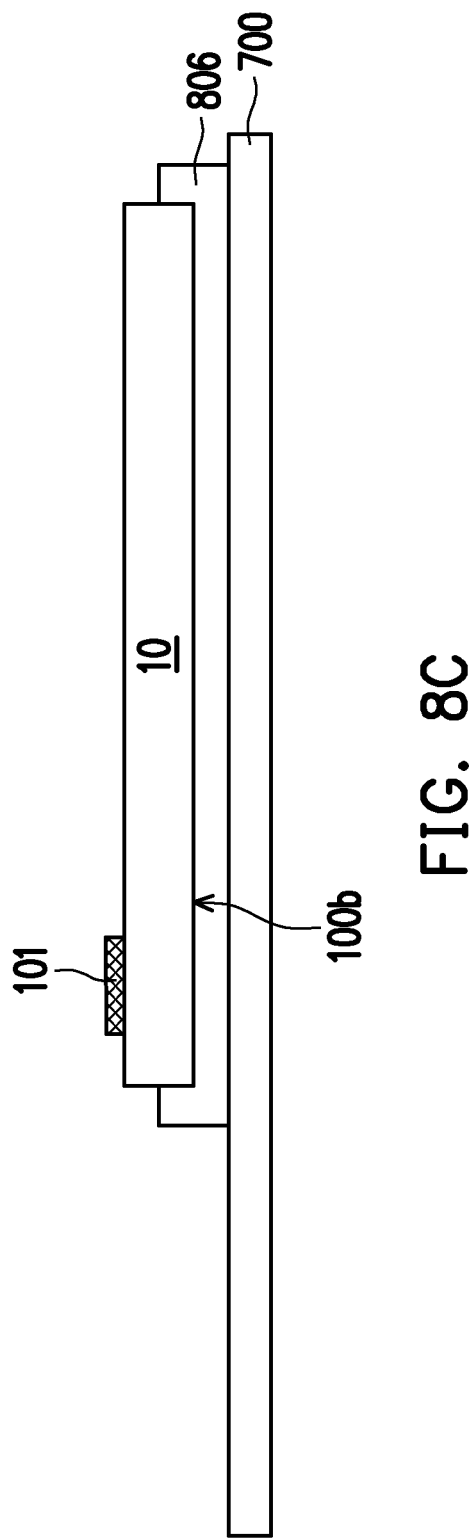

As shown in FIG. 8C, the fixing pedestals 806 are disposed on the fabric substrate 700, and the circuit apparatuses 10 are accommodated in the fixing pedestals 806. In this way, the circuit apparatuses 10 may be firmly bonded with the fabric substrate 700.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit apparatus, comprising:
a flexible circuit board, having at least one hollow pattern, wherein the flexible circuit board has an inner region and a peripheral region surrounding the inner region and has a first surface and a second surface opposite to each other;
a flexible packaging material layer, disposed in the at least one hollow pattern; and
an electronic device, disposed on the first surface of the flexible circuit board and electrically connected to the flexible circuit board,
wherein a position of the electronic device is not overlapped with a position of the hollow pattern.

2. The circuit apparatus of claim 1, wherein the at least one hollow pattern is located in the peripheral region.

3. The circuit apparatus of claim 2, wherein the at least one hollow pattern is located at a corner of the flexible circuit board.

4. The circuit apparatus of claim 2, wherein the at least one hollow pattern is located at a side other than a corner of the flexible circuit board.

5. The circuit apparatus of claim 2, wherein the at least one hollow pattern extends from an edge of the flexible circuit board into the inner region.

6. The circuit apparatus of claim 2, wherein at one side of the flexible circuit board, the total length of the at least one hollow pattern extending along an edge of the flexible circuit board is between 1% and 90% of the length of the side, when viewed from a top view above the flexible circuit board.

7. The circuit apparatus of claim 1, wherein the total area of the at least one hollow pattern is between 1% and 50% of the area of the flexible circuit board when viewed from a top view above the flexible circuit board.

8. The circuit apparatus of claim 1, wherein the hollow pattern is independently located in the inner region.

9. The circuit apparatus of claim 1, further comprising a rigid material layer disposed on the second surface of the flexible circuit board and located below the electronic device.

10. The circuit apparatus of claim 1, wherein the flexible packaging material layer covers the first surface of the flexible circuit board.

11. The circuit apparatus of claim 1, further comprising an encapsulation layer disposed on the second surface of the flexible circuit board.

12. The circuit apparatus of claim 11, wherein the material of the encapsulation layer is the same as the material of the flexible packaging material layer.

13. A circuit system, comprising:
- a fabric substrate;
- a circuit apparatus, disposed on the fabric substrate, comprising:
- a flexible circuit board, having at least one hollow pattern, wherein the flexible circuit board has an inner region and a peripheral region surrounding the inner region and has a first surface and a second surface opposite to each other;
- a flexible packaging material layer, disposed in the at least one hollow pattern; and
- an electronic device, disposed on the first surface of the flexible circuit board and electrically connected to the flexible circuit board; and
- a conductive line, disposed on the fabric substrate and electrically connected to the electronic device,
- wherein a position of the electronic device is not overlapped with a position of the hollow pattern.

14. The circuit system of claim 13, further comprising an adhesion layer disposed between the second surface of the flexible circuit board and the fabric substrate and between the conductive line and the fabric substrate.

15. The circuit system of claim 13, further comprising a first fixing apparatus and a second fixing apparatus, wherein the first fixing apparatus is disposed on the second surface of the flexible circuit board, the second fixing apparatus is disposed on the fabric substrate, and the first fixing apparatus is attached to the second fixing apparatus.

16. The circuit system of claim 15, wherein the first fixing apparatus and the second fixing apparatus are attached together through fasteners, magnetic attraction, electrostatic attraction or pasting.

17. The circuit system of claim 13, further comprising a fixing pedestal disposed on the fabric substrate, wherein the circuit apparatus is accommodated in the fixing pedestal.

18. The circuit system of claim 13, wherein the flexible circuit board comprises a pad exposed at the first surface, and the conductive line is connected to the pad.

19. A manufacturing method of a circuit apparatus, comprising:
- providing a flexible circuit board;
- forming an electronic device on the flexible circuit board;
- forming at least one hollow pattern in the flexible circuit board; and
- filling the hollow pattern with a flexible packaging material,
- wherein a position of the electronic device is not overlapped with a position of the hollow pattern.

* * * * *